US011510345B1

(12) United States Patent
Ross et al.

(10) Patent No.: US 11,510,345 B1
(45) Date of Patent: Nov. 22, 2022

(54) COOLING SYSTEM WITH LEAKAGE TOLERANCE

(71) Applicant: Amazon Technologies, Inc., Seattle, WA (US)

(72) Inventors: Peter Ross, Olympia, WA (US); Zhiyong Lin, Issaquah, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 17/119,746

(22) Filed: Dec. 11, 2020

(51) Int. Cl.
*H05K 7/20* (2006.01)

(52) U.S. Cl.
CPC ....... *H05K 7/2079* (2013.01); *H05K 7/20745* (2013.01)

(58) Field of Classification Search
CPC .............. H05K 7/2079; H05K 7/20745
See application file for complete search history.

(56) References Cited

U.S. PATENT DOCUMENTS

| | | | | |
|---|---|---|---|---|
| 5,086,829 A * | 2/1992 | Asakawa | ........... | H05K 7/20281 165/104.33 |
| 7,447,026 B2 * | 11/2008 | Murakami | ......... | H05K 7/20754 165/104.33 |
| 2008/0101023 A1 * | 5/2008 | Hsu | ........................ | H01L 23/473 361/699 |
| 2013/0050931 A1 | 2/2013 | Heiland et al. | | |
| 2013/0091880 A1 * | 4/2013 | Inadomi | ................ | F25B 23/006 62/119 |
| 2016/0205810 A1 | 7/2016 | Marshall | | |
| 2019/0113247 A1 * | 4/2019 | Lepoudre | ........... | H05K 7/20327 |
| 2020/0400348 A1 * | 12/2020 | Sakuma | ............. | H05K 7/20327 |

OTHER PUBLICATIONS

U.S. Appl. No. 17/110,134, filed Dec. 2, 2020 Titled: "Cooling System With a Booster".

* cited by examiner

*Primary Examiner* — Mukundbhai G Patel (74) *Attorney, Agent, or Firm* — Kilpatrick Townsend & Stockton LLP (57) ABSTRACT

An environmental control system is provided. The environmental control system can include a heat absorption device and a heat rejection device positioned in containment areas and a reservoir. The containment areas can contain leaks that may occur in the environmental control system and direct the fluid into the reservoir. The reservoir can include an opening that can allow the environmental control system to operate as a low pressure system.

18 Claims, 4 Drawing Sheets

COOLING SYSTEM WITH LEAKAGE TOLERANCE

BACKGROUND

A data center is a facility used to house a collection of data center electronic components such as computer servers and associated components, such as network hardware. The collection of computer servers is often called a "server cluster" or "server farm," and is designed to accomplish server needs far beyond the capability of a single machine. The networking hardware typically includes network switches and/or routers which enable communication between the different parts of the server farm and the users of the server farm.

Server farms are commonly used for cluster computing, web services, remote data storage, web hosting, and other web services. Server farms are increasingly being used by enterprises instead of, or in addition to, mainframe computers. As the demand for server farms continues to increase, a need exists to limit the cost of operating a data center. Often, a pertinent part of the cost of operating a data center relates to the costs of cooling the electronic components. Such costs may be incurred by monitoring the cooling system and responding to potential leaks.

BRIEF DESCRIPTION OF THE DRAWINGS

Various embodiments in accordance with the present disclosure will be described with reference to the drawings, in which.

DETAILED DESCRIPTION

Examples herein are directed to, among other things, systems and techniques relating to an environmental control system, for example, which may be particularly suited for use in a data center environment. The techniques described herein may be implemented by any environmental control system, but particular examples described herein can be a low pressure environmental control system that provides cooling, for example, to a data center. The low pressure environmental control system can include a fluid reservoir at an ambient pressure. The fluid reservoir can include various openings for receiving and outputting fluid to cooling components in the data center. For example, the fluid reservoir can output fluid to a heat absorption device and receive fluid from a heat rejection device. The heat absorption device and the heat rejection device can each be positioned in a fluid containment area in the data center. The fluid containment areas can contain fluid that may leak from the heat absorption device or the heat rejection device and drain the fluid into the fluid reservoir. Draining the leaking fluid back into the fluid reservoir can allow the system to continue to operate for an extended period of time after a leak has occurred.

Turning now to a particular example, in this example, a data center can include a low pressure environmental control system. The control system can include a heat absorption device, a heat rejection device, and a reservoir. The heat absorption device and the heat rejection device can be positioned in containment areas in the data center. The reservoir can be an open reservoir (e.g., at an ambient pressure) that holds fluid. The fluid can flow from the reservoir to the heat absorption device which can use the fluid to generate cool air in the data center. The heat rejection device can receive the fluid from the heat absorption device and cool the fluid by rejecting heat into the environment outside the data center. The cooled fluid can flow from the heat rejection device into the reservoir. The fluid flowing through the environmental control system may leak out of the system, for example, at the heat absorption device and/or the heat rejection device. The low pressure of the system (e.g., with the reservoir at an ambient pressure) can reduce the pressure with which the fluid leaks (e.g., the fluid won't spray into the data center at a high pressure). The containment areas can include drain pans that can collect the leaking fluid and drain the fluid into the reservoir. Collecting the leaking fluid and directing it back into the reservoir can allow the environmental control system to continue to operate while the leak occurs. For example, the environmental control system can continue to operate (e.g., cool the data center) until routine maintenance can be performed on the system.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Figure 1:
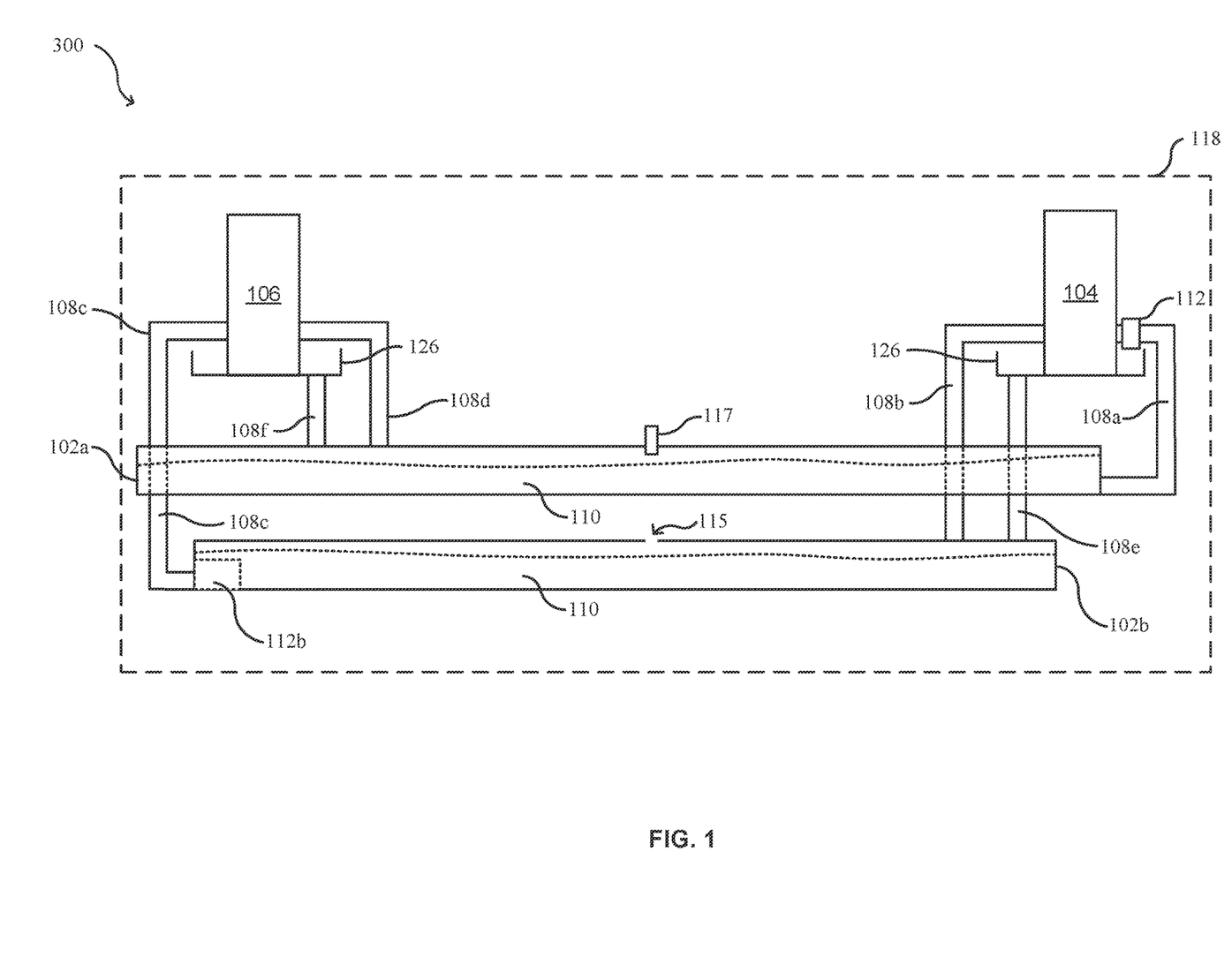
FIG. 1 illustrates a simplified diagram of an example environmental control system in accordance with various embodiments.

Turning now to the figures, FIG. 1 shows a simplified diagram of an example environmental control system 100. The environmental control system 100 can include one or more reservoirs 102, a heat absorption device 104, and a heat rejection device 106 connected to one another through conduits 108 (e.g., pipes, troughs, and/or any suitable device for transporting the fluid 110). The reservoirs 102 (e.g., a cold reservoir 102a and a hot reservoir 102b) can contain fluid 110. The fluid 110 can flow from the cold reservoir 102a to the heat absorption device 104 (e.g., via conduit 108a). For example, the fluid 110 can be pumped from the reservoir 102 using, for example, a pump 112a. The pump 112a can be positioned next to the heat absorption device 104 (e.g., above a containment area). The fluid 110 in the cold reservoir 102a can be at a temperature lower than an ambient temperature (e.g., a cool temperature). The heat absorption device 104 can receive the fluid 110 and output air into the environment 118 (e.g., as shown by dashed lines). For example, the heat absorption device 104 can output air at a temperature below the ambient temperature of the environment 18. The heat absorption device 104 can output the fluid 110 to the hot reservoir 102b (e.g., the hot reservoir) via conduit 108b. The fluid 110 can be output from the heat absorption device 104 at a temperature that is higher than the temperature at which the fluid 110 was received by the heat absorption device 104. For example, the heat absorption device 104 can cause the fluid 110 to heat while generating the cool air.

The hot reservoir 102b can contain the fluid 110 at a temperature at or close to the temperature of the fluid 110 leaving the heat absorption device 104. The hot reservoir 102b can output the fluid 110 to the heat rejection device 106 via conduit 108c. For example, pump 112b can pump the fluid 110 to the heat rejection device 106. The pump 112b can be positioned within the hot reservoir 102b and/or may be positioned outside the hot reservoir 102b, for example, at a position similar to the position of pump 112a. The heat rejection device 106 can receive the fluid 110 from the hot reservoir 102b. The heat rejection device 106 can output, for example, into an environment that is separate from the environment 118 (e.g., outside the dashed lines). The air output by the heat rejection device 106 can be at a higher temperature than the air output by the heat absorption device 104. The heat rejection device 106 can remove heat from the fluid 110 and lower the temperature of the fluid 110 (e.g., to a temperature below the temperature at which the fluid was output from the heat absorption device 104). The fluid 110 can flow from the heat rejection device 106 to the cold reservoir 102a (e.g., via conduit 108d).

The heat absorption device 104 and/or the heat rejection device 106 can be positioned within containment areas 126. The containment areas 126 can contain fluid 110 that may leak from the environmental control system 100. For example, the containment areas 126 can be or include a drain pan with a drain that can direct the leaking fluid 110 into the reservoir 102 (e.g., in direction 128 and direction 130). The fluid 110 can flow from the containment areas 126 to the reservoir 102 via conduits 108 (e.g., via conduits 108f and 108e). In various embodiments, the reservoir 102 can be positioned at a lower elevation than the containment areas 126. The lower elevation can allow the fluid 110 to drain into the reservoir 102 without the use of a pump (e.g., a sump pump). Containing the leaking fluid 110 can allow the environmental control system 100 to continue to operate, for example, until the leak can be fixed.

In a traditional system, leaking fluid can cause the system to fail without immediate intervention (e.g., without immediate maintenance to fix the leak). Whereas, in the present system, leaks may occur and can be contained using containment areas 126. Some or all of the leaking fluid can be reintroduced back into the system (e.g., via draining the fluid 110 into the reservoir 102) and can allow the environmental control system 100 to continue to operate. For example, the environmental control system 100 can continue to operate until routine maintenance is performed to fix the leak.

In various embodiments, the reservoir 102 can include an opening 115 that can allow the pressure inside the reservoir 102 to remain at or near the pressure of the environment 118 (e.g., atmospheric pressure). In some embodiments, a vent 117 can extend into the environment 118 and allow the pressure inside the reservoirs 102 to be the same as or similar to the pressure in the environment 118. The pressure in the reservoir 102 being at or near atmospheric pressure and/or the pressure of the environment 118, can allow the environmental control system 100 to operate at a lower pressure than traditional environmental control systems. For example, traditional systems can have a closed loop system that pressurizes the fluid in the system to around 125 pounds per square inch (psi). The high pressure in the closed system can cause fluid leaking from the system to spray into the surrounding environment which can be difficult to contain and can deplete the fluid in the system. The environmental control system 100 may have low pressure leaks, however, unlike the traditional systems, the low pressure leaks can be contained by the containment areas 126 and reintroduced into the environmental control system 100 via the reservoir 102.

The environmental control system 100 can include limited areas of where the fluid 110 is pressurized. The fluid 110 in the conduits 108 and reservoirs 102 can be at or near atmospheric pressure except for the conduits 108 between the pumps 112 and the heat absorption device 104 or the heat rejection device 106. For example, the fluid 110 in the reservoirs 102a and 102b and conduits 108b, 108d, 108e, and 108f can be at atmospheric pressure and the fluid 110 can be pressurized in conduits 108a and 108c. The connection between the pressurized conduits 108 and the respective devices can be positioned above a containment area 126. For example, the containment area 126 can contain a leak from the connection.

Figure 2:
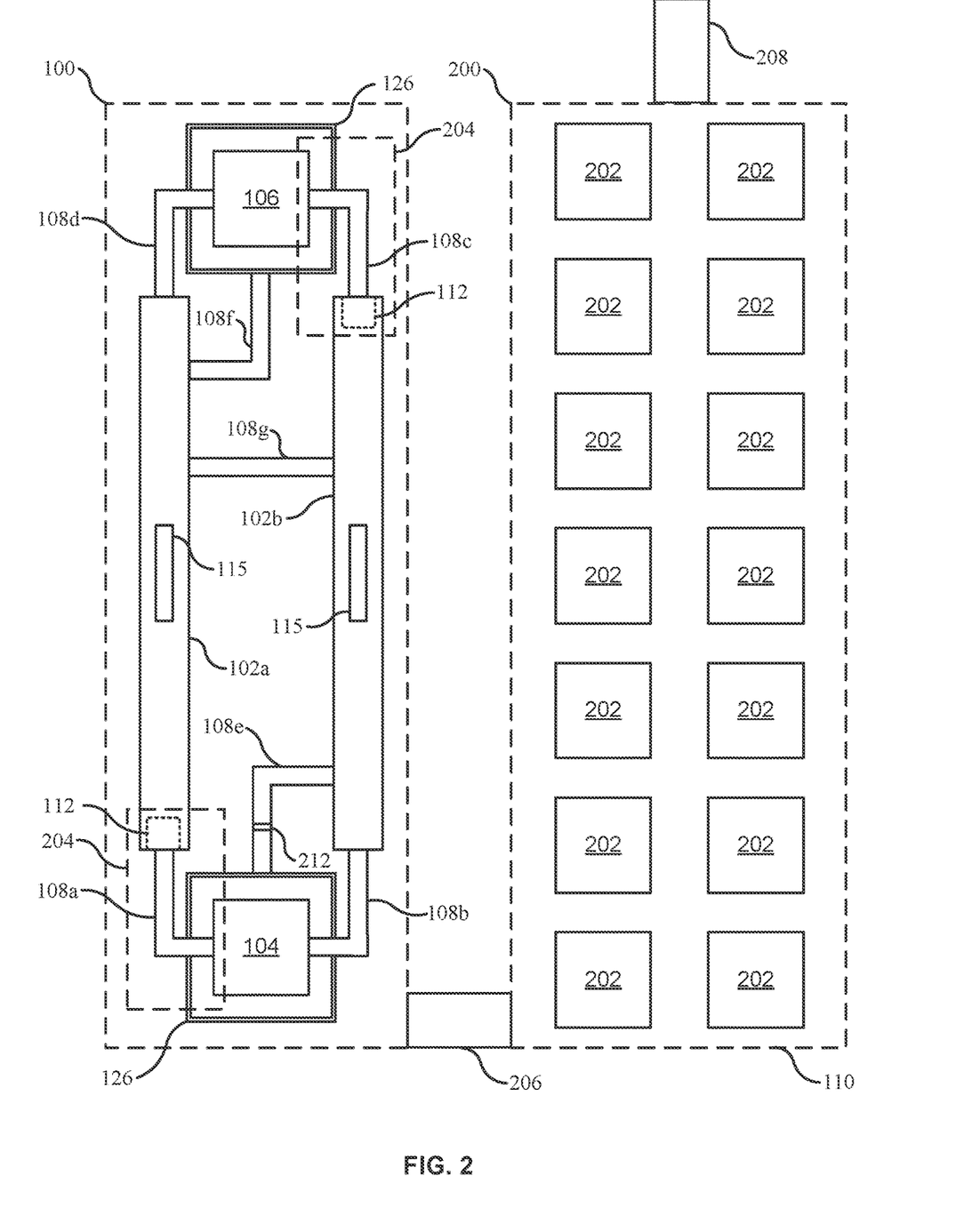
FIG. 2 illustrates an example data center and the example environmental control system according to FIG. 1, in accordance with various embodiments.

FIG. 2 illustrates an example data center 200 connected with the environmental control system 100 of FIG. 1. The data center 200 can include server racks 202 positioned within the data center 200 (as shown in dashed lines). The data center 200 can be or include a building containing one or more rooms. Each of the rooms may have their own environmental control system 100 or several rooms may share an environmental control system 100. The data center 200 can separate the environment inside the data center 200 from the surrounding environment.

The data center 200 can have an associated pressure and temperature (e.g., an ambient pressure and an ambient temperature respectively). The pressure and/or the temperature of the data center 200 can differ from the pressure and/or the temperature of the environment outside the data center 200. For example, the ambient temperature of the data center 200 may be at a lower temperature than the temperature outside of the data center 200.

The environmental control system 100 can be positioned external to the data center 200 (e.g., in a separate building or in a separate area of the same building) and/or may be positioned within the data center 200. For example, the environmental control system 100 can be positioned exterior to the data center 200 and can feed cold air into the data center via a duct 206. An exhaust 208 can be used to vent hot air from the data center 200, for example, into the surrounding environment.

The server racks 202 can include various electronic components. In various embodiments, the server racks 202 can be turned sideways, and may require some spacing between the server racks 202, for example, exhausting of the servers. Whereas servers which exhaust out through a back exhaust fan can be installed immediately adjacent to one another. The differentiation in these two structures may warrant some alterations to placement of climate control system elements relative to a given server rack 202, but in general, embodiments herein can utilize the same structure of climate control system components for server racks 202 containing different electronic components.

The environmental control system 100 can include a cold reservoir 102a connected to a heat absorption device 104 and a hot reservoir 102b connected to a heat rejection device 106 via conduits 108. The reservoirs 102 can be or include a container for containing fluid 110. For example, the reservoirs 102 can include a watertight container that can hold the fluid 110. The reservoir 102 can include various openings (e.g., inputs and outputs). The reservoirs 102 can be sized to contain more fluid 110 than the system needs to operate. For example, the reservoirs 102 can be sized to hold fluid 110 even when the rest of the system is completely filled with fluid 110. The reservoirs 102 can include dimensions that allow the fluid 110 to remain at a predetermined level. For example, the reservoirs 102 can be dimensioned to allow the fluid 110 to remain below input openings in the reservoirs 102. The fluid 110 can additionally or alternatively be at a level that allows a portion of the fluid 110 to return to the reservoirs 102 at a slower rate. For example, leaking fluid 110 may return to the reservoirs 102 slower than fluid 110 flowing through system. The fluid 110 in the reservoirs 102 can be used to continue the operation of the environmental control system 100 while the slower flowing fluid 110 returns to the reservoirs 102. The reservoirs 102 can be or include metal, rubber, or similar material.

The reservoirs 102 can be positioned next to one another. For example, a the cold reservoir 102a can be positioned above the hot reservoir 102b. However, the reservoirs 102 can be positioned side by side or the hot reservoir 102b can be positioned above the cold reservoir 102a. In some embodiments, the reservoirs 102 can be contained in a single container. For example, a container can contain multiple compartments where one or more of the compartments is a reservoir 102.

In various embodiments, the reservoirs 102 can be open reservoir, for example, by having an opening 115 that can allow the pressure in the interior of the reservoir 102 to be similar to or the same as atmospheric pressure and/or the pressure in the data center 200. In further embodiments, the reservoirs 102 can be connected via one or more conduits 108 (e.g., conduit 108g). The conduits 108 can allow fluid 110 to flow back and forth between the reservoirs 102. For example, the conduits 108 can allow the fluid 110 to flow from one reservoir 102 to the other reservoir 102 after one reservoir 102 is filled with fluid 110. The flowing of the fluid 110 between the reservoirs 102 can allow the fluid 110 to remain relatively even between the reservoirs 102. In some embodiments, the reservoirs 102 may be at a negative pressure (e.g., a pressure below atmospheric). The reservoirs 102 at the negative pressure can draw the fluid 110 from the containment areas 126.

The fluid 110 can be or include fluid that can absorb and expel heat. For example, the fluid 110 can have properties that are optimized for heat absorption. In various embodiments, the fluid 110 can be or include water, glycol, alcohol, and/or any suitable fluid for use in an environmental control system (e.g., HVAC, a heat exchanger, and/or a chiller).

One or more pumps 112 can pump the fluid 110, for example, to or from the reservoirs 102. For example, the pumps 112 can pump the fluid 110 around some or all of the environmental control system 100. For example, the pumps 112 can pump the fluid 110 with enough pressure to overcome pressure losses in the environmental control system 100. In various embodiments, the pumps 112 can be positioned in the interior of the reservoir 102 (e.g., at least partially submerged in the fluid 110). However, the pump 112 may be positioned on the exterior of the reservoir 102. For example, the pumps 112 can be positioned above the containment areas 126. The pumps 112 can pump the fluid 110 from the reservoirs 102 (e.g., to the heat absorption device 104 and/or the heat rejection device 106) and/or can pump the fluid 110 into the reservoir 102 (e.g., from the containment areas 126). In some embodiments, one or more pumps 112 can pump the fluid 110 out of the reservoir 102 and/or one or more pumps 112 can pump the fluid 110 into the reservoir 102. The pumps 112 can create high pressure areas 204 in the environmental control system 100. For example, the high pressure areas 204 can be areas between the pumps 112 and the heat rejection device 106 and/or heat absorption device 104. The high pressure areas 204 can be areas where the fluid 110 is at a higher pressure than atmospheric pressure and/or the pressure in the data center 200. The high pressure areas 204 can be less than the full environmental control system 100. For example, the environmental control system 100 can include areas that are at atmospheric pressure. The pumps 112 can be or include a sump pump, a positive-displacement pump, a centrifugal pump, an axial pump, and/or any pump suitable for pumping fluid.

In various embodiments, the flow of the fluid 110 from the containment areas 126 can be aided, for example, using gravity. For example, the reservoirs 102 can be positioned at a lower elevation than the heat absorption device 104, the heat rejection device 106, and/or the containment areas 126. The lower elevation can allow the fluid 110 to flow from the higher elevation to the lower elevation using gravity force. Using gravity to aid the flow of the fluid 110 can increase the reliability of the environmental control system 100, for example, by reducing the amount of powered components (e.g., pumps) that are used in the system.

Conduits 108 can connect various components of the environmental control system 100 with one another to allow the fluid 110 to flow between the components. For example, conduits 108 can connect the reservoir 102 with the heat absorption device 104, the heat rejection device 106, and/or the containment areas 126. The conduits 108 can be or include a device suitable for transporting fluid. For example, the conduits 108 can be or include copper, steel, plastic, or any suitable material for transporting fluid. Multiple types of conduits 108 can be used in the environmental control system 100. For example, copper conduits may be used to transport the fluid 110 to the heat absorption device 104 and/or the heat rejection device 106 and plastic conduits may be used to transport the fluid 110 from the containment areas 126 to the reservoirs 102.

In various embodiments, one or more of the conduits 108 can include a sensor 212. The sensor 212 can detect one or more characteristics associated with the conduit 108 and/or the fluid 110. For example, the sensor 212 can detect the flow rate of the fluid 110 in the conduit. In some embodiments, sensors 212 can be positioned in the conduits 108 from the containment areas 126 to the reservoir 102. The sensors 212 can detect the flow rate of the fluid 110 in the conduits 108. The flow rate of the fluid 110 can be used to determine if a leak has occurred in the environmental control system 100.

The conduits 108 can be connected to one another and/or the components of the environmental control system 100, for example, via an inlet or outlet port. The conduits 108 can be positioned within the data center 200 to reduce the connections. For example, the conduits 108 can be positioned to connect to the heat absorption device 104 and/or the heat rejection device 106 at a point above the containment areas 126. The conduits 108 having connections above the containment areas 126 can allow the containment areas 126 to contain fluid 110 leaking from the conduits 108. For example, the conduits 108 may leak fluid 110 at the connection points and the leaking fluid 110 can flow into the reservoir 102 via the containment areas 126. Capturing the leaking fluid 110 can allow the environmental control system to continue to operate until maintenance can be performed, for example, to stop the leak.

The heat absorption device 104 can receive the fluid 110, for example, from the cold reservoir 102a and can use the fluid 110 to cool the air inside the data center 200. The pump 112 can cause the fluid 110 to flow through conduit 108a to the heat absorption device 104. However, the fluid 110 may flow through several conduits to the heat absorption device 104. The fluid 110 can be pressurized and flow in the high pressure area 204. The fluid 110 flowing to the heat absorption device 104 can be at a temperature below the ambient temperature of the data center 200. In various embodiments, the fluid 110 can be cooled to a temperature below the ambient temperature of the data center 200. The heat absorption device 104 can receive the fluid 110 and cool the air in the data center 200. For example, the heat absorption device 104 can intake air (e.g., from the data center 200), cool the air, and output the cool air (e.g., back into the data center 200). In various embodiments, the heat absorption device 104 can intake and/or output the air through duct 206 connecting the environmental control system 100 and the data center 200. Cooling of the air can cause the fluid 110 to have a higher temperature exiting the heat absorption device 104 than entering the heat absorption device 104. The heat absorption device 104 can be or include an air handling unit, a computer room air handling unit, an air handling unit with chilled water coil, and/or any cooling unit suitable for providing cool air to a data center 200.

The fluid 110 can flow from the heat absorption device 104 to the hot reservoir 102b via conduit 108b. The heat rejection device 106 can receive the fluid 110 from the hot reservoir 102b and cool the fluid 110. The heat rejection device 106 can cool the fluid 110 to a temperature lower than the temperature of the fluid 110 when the fluid 110 is received. The cooling of the fluid 110 can include outputting air (e.g., air at a temperature greater than the temperature of the air being output by the heat absorption device 104). The air can be output to an environment that is separate from the data center 200. For example, the air can be output outside the data center 200. In some embodiments, the heat rejection device 106 can include a portion positioned outside the data center 200. The heat rejection device 106 can be or include a dry fluid cooler, a heat exchanger, and/or any device suitable for cooling the fluid 110.

The heat rejection device 106 and/or the heat absorption device 104 can be positioned in a containment area 126. The containment area 126 can contain fluid 110 that may leak from the conduits 108, the heat absorption device 104, and/or the heat rejection device 106. In various embodiments, the containment area 126 can include a drain pan coupled to the reservoir 102. The drain pan can be a structure that can be positioned in the data center 200 to contain the fluid 110. The drain pan may be sloped to cause the fluid 110 to flow toward the drain. The drain can be connected to a conduit 108 to allow the fluid 110 to flow to the reservoir 102. The conduit 108 can contain a sensor 212 to detect the flow rate of the fluid 110 from the containment area 126 to the reservoir 102. The flow rate can be used, for example, to determine the rate of the leak, the severity of the leak, and/or whether the leak is increasing. The containment areas 126 containing the leaking fluid 110 can allow the system to continue to operate until maintenance is performed on the environmental control system 100 (e.g., the leak is fixed).

Figure 3:
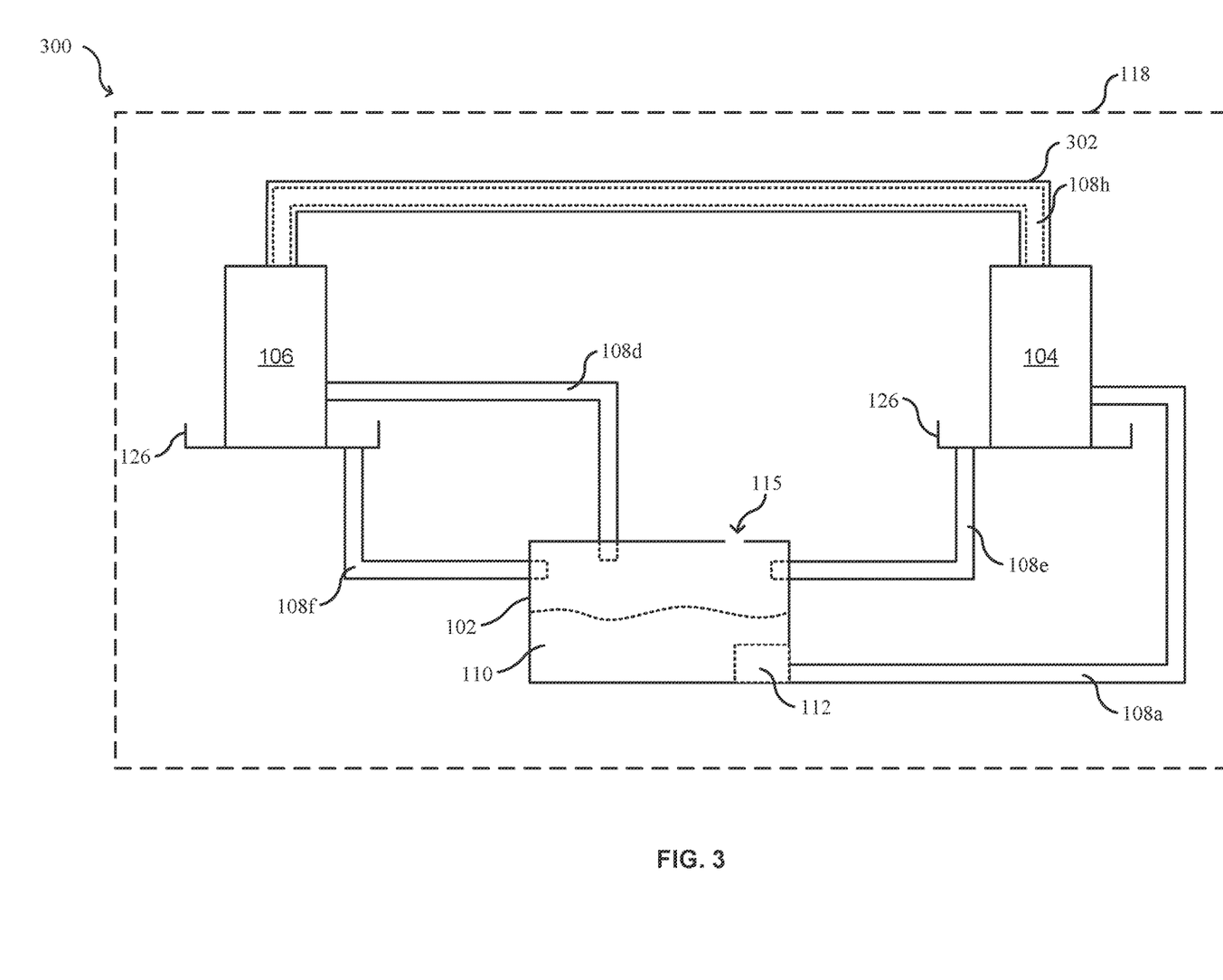
FIG. 3 illustrates an additional environmental control system for use with the example data center of FIG. 2, in accordance with various embodiments.
Figure 4:
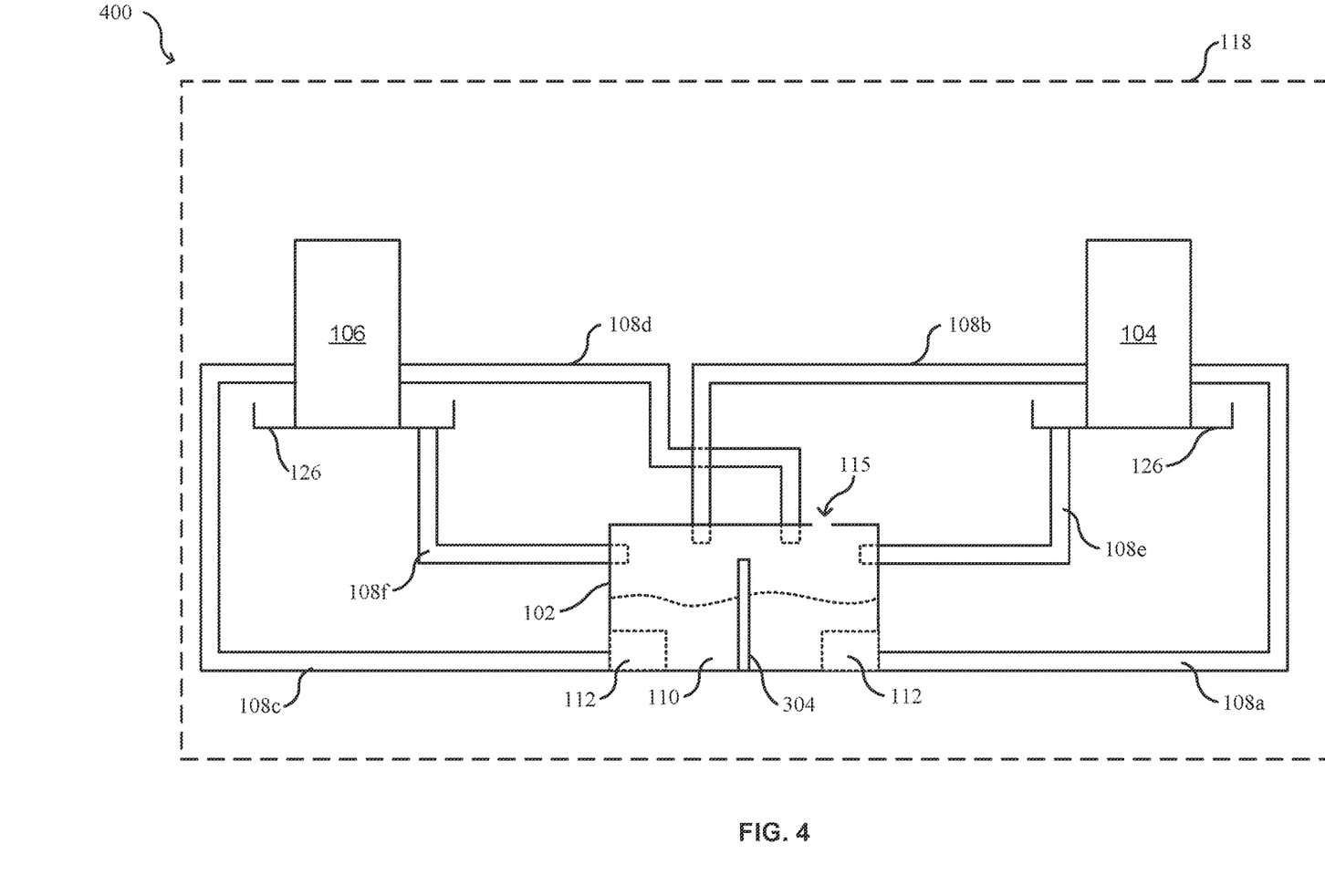
FIG. 4 illustrates another environmental control system for use with the example data center of FIG. 2, in accordance with various embodiments.

Turning to FIGS. 3 and 4 additional environmental control systems 300 and 400 for use with the example data center 200 of FIG. 2 are shown. FIG. 3 shows an environmental control system 300 that includes a single reservoir 102. The environmental control system 300 can include a heat absorption device 104 and a heat rejection device 106 connected to the reservoir 102. The reservoir 102 can output fluid 110 to the heat absorption device 104 via conduit 108a. Pump 112 can pump the fluid 110 to the heat absorption device 104. The heat absorption device 104 can output the fluid 110 to the heat rejection device 106 via conduit 108h.

The conduit 108h can be surrounded by an outer conduit 302. The outer conduit 302 can contain fluid that may leak from the conduit 108b and direct the fluid to the reservoir 102, for example, via the containment areas 126. The heat rejection device 106 can output the fluid 110 into the reservoir 102.

As shown in FIG. 4, in some embodiments, the reservoir 102 can include a retaining wall 304. The retaining wall 304 can separate the fluid 110 in the reservoir 102. For example, the retaining wall 304 can separate the fluid 110 into a hot side and a cold side. The retaining wall 304 can be positioned in the reservoir 102 such that the fluid 110 from the one side can flow into the other. For example, if the hot side of the reservoir 102 has too much fluid 110 the fluid can overflow to the cold side.

The cold side of the reservoir 102 can output the fluid 110 to the heat absorption device 104 via conduit 108a. The heat absorption device 104 can output the fluid 110 to the hot side of the reservoir 102 via conduit 108b. The hot side of the reservoir 102 can output the fluid 110 from the hot side to the heat rejection device 106. The heat rejection device 106 can receive the fluid 110 and cool the fluid 110. The heat rejection device 106 can output the cooled fluid 110 to the cold side of the reservoir 102. The containment areas 126 can drain leaking fluid 110 into the hot and/or cold side of the reservoir 102.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments are described herein, including the many modes known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A data center, comprising
   a room having a first environment at a first pressure;
   a plurality of data center components positioned within the room; and
   an environmental control system comprising:
     a first containment area comprising a first drain pan;
     a second containment area comprising a second drain pan;
     a heat absorption device positioned above the first drain pan so that the first drain pan captures fluid leaking from the heat absorption device, the heat absorption device configured to cool an airflow for circulation within the data center using the fluid;
     a heat rejection device positioned above the second drain pan so that the second drain pan captures fluid leaking from the heat rejection device, wherein the heat rejection device is configured to cool the fluid flowing through the heat rejection device;
     a cold reservoir defining an interior volume at atmospheric pressure, the cold reservoir configured to receive fluid from the heat rejection device at atmospheric pressure; and
     a hot reservoir defining an interior volume at atmospheric pressure, the hot reservoir configured to receive fluid from the heat absorption device at atmospheric pressure,
     wherein the hot reservoir and the cold reservoir receive fluid through a pipe from the first or second drain pans.

2. The data center of claim 1, wherein the heat absorption device comprises an air handling unit or a heat exchanger and the heat rejection device comprises a dry fluid cooler or a heat exchanger.

3. The data center of claim 1, wherein the environmental control system further comprises a sensor configured to detect data associated with the fluid.

4. The data center of claim 1, wherein the hot reservoir or the cold reservoir is positioned at a lower elevation than the first or second containment areas.

5. An environmental control system comprising:
   a heat absorption device configured to cool an airflow for circulation within a first environment by transferring heat from the airflow to fluid flowing through the heat absorption device;
   a heat rejection device configured to cool the fluid flowing through the heat rejection device;
   a first reservoir defining an interior volume at atmospheric pressure, the first reservoir configured to receive the fluid from the heat rejection device at atmospheric pressure;
   a second reservoir defining an interior volume at atmospheric pressure, the second reservoir configured to receive the fluid from the heat absorption device at atmospheric pressure; and
   first and second containment areas positioned below the heat absorption device and the heat rejection device, respectively, wherein the first and second containment areas are configured to direct captured fluid to the first or second reservoirs.

6. The environmental control system of claim 5, wherein the first containment area is further configured to capture fluid that has been separated from the fluid flowing through the heat absorption device.

7. The environmental control system of claim 6, wherein the second containment area is further configured to capture fluid that has been separated from the fluid flowing through the heat rejection device.

8. The environmental control system of claim 5, wherein the first or second containment area comprises a drain pan having a drain fluidly coupled with the first or second reservoir.

9. The environmental control system of claim 5, wherein the first or second containment area comprises a pump configured to pump the fluid to the first or second reservoir.

10. The environmental control system of claim 5, wherein the first reservoir comprises a pump configured to output fluid to the heat absorption device at a pressure higher than atmospheric pressure.

11. The environmental control system of claim 5, wherein the environmental control system is in a data center.

12. A data center, comprising:
    a first environment;
    a plurality of data center components positioned within the first environment; and
    an environmental control system comprising:
      a first containment area and a second containment area;
      a heat absorption device positioned above the first containment area and configured to cool an airflow by transferring heat from the airflow to fluid flowing through the heat absorption device;
      a heat rejection device positioned above the second containment area and configured to cool fluid flowing through the heat rejection device;
      a first reservoir defining an interior volume at atmospheric pressure, the first reservoir configured to receive the fluid from the heat rejection device at atmospheric pressure; and
      a second reservoir defining an interior volume at atmospheric pressure, the second reservoir configured to receive the fluid from the heat absorption device at atmospheric pressure,
      wherein the first and second reservoirs receive fluid through a pipe from the first or second containment areas.

13. The data center of claim 12, wherein the first or second reservoir comprises a pump positioned within the interior volume.

14. The data center of claim 12, wherein the environmental control system further comprises a connector coupling the heat absorption device and the heat rejection device, the connector comprising an interior conduit configured to transport the fluid between the heat absorption device and the heat rejection device and an exterior conduit configured to contain fluid leaking from the interior conduit.

15. The data center of claim 14, wherein the first containment area is configured to capture fluid separated from fluid flowing through the heat absorption device.

16. The data center of claim 15, wherein the second containment area is configured to capture fluid separated from fluid flowing through the heat rejection device.

17. The data center of claim 12, wherein the first reservoir is fluidly coupled with the second reservoir.

18. The data center of claim 12, wherein the fluid is output from the first and second reservoir at a pressure higher than atmospheric pressure.

\* \* \* \* \*